(12) United States Patent
Micheloni et al.

(10) Patent No.: US 6,922,366 B2
(45) Date of Patent: Jul. 26, 2005

(54) SELF-REPAIR METHOD FOR NONVOLATILE MEMORY DEVICES USING A SUPERSECURE ARCHITECTURE, AND NONVOLATILE MEMORY DEVICE

(75) Inventors: Rino Micheloni, Turate (IT); Aldo Losavio, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 87 days.

(21) Appl. No.: 10/423,845

(22) Filed: Apr. 24, 2003

(65) Prior Publication Data

US 2003/0235092 A1 Dec. 25, 2003

(30) Foreign Application Priority Data

Apr. 26, 2002 (EP) .............................. 02425265

(51) Int. Cl.$^7$ .............................. G11C 16/04
(52) U.S. Cl. ..................... 365/189.07; 365/189.01; 365/189.04; 365/191; 365/194
(58) Field of Search ................ 365/189.07, 189.01, 365/189.04, 191, 194

(56) References Cited

U.S. PATENT DOCUMENTS

| 5,438,546 A | 8/1995 | Ishac et al. ............... 365/200 |
| 5,682,349 A | 10/1997 | Campardo et al. ...... 365/185.29 |
| 5,748,527 A | 5/1998 | Lee et al. ............... 365/185.09 |
| 5,751,647 A | 5/1998 | O'Toole ................... 365/200 |
| 5,796,653 A | 8/1998 | Gaultier ................ 365/185.09 |
| 5,818,791 A | 10/1998 | Tanaka et al. ......... 365/230.06 |
| 5,909,390 A | 6/1999 | Harari .................. 365/185.03 |
| 5,928,370 A | 7/1999 | Asnaashari .................. 714/48 |
| 6,236,609 B1 | 5/2001 | Tanzawa et al. ............ 365/218 |
| 6,418,051 B2 | 7/2002 | Manstretta et al. .... 365/185.09 |
| 6,442,080 B2 * | 8/2002 | Tanzawa et al. ....... 365/189.09 |
| 6,459,628 B1 * | 10/2002 | Bautista et al. ............. 365/194 |
| 6,498,752 B1 | 12/2002 | Hsu et al. .............. 365/185.22 |
| 2002/0012282 A1 | 1/2002 | Saito et al. ................ 365/200 |
| 2002/0046318 A1 | 4/2002 | Harari et al. ................ 711/103 |

FOREIGN PATENT DOCUMENTS

| EP | 0 797 145 A1 | 9/1997 |
| EP | 1 126 372 A1 | 8/2001 |

\* cited by examiner

Primary Examiner—Richard Elms
Assistant Examiner—Pho M. Luu
(74) Attorney, Agent, or Firm—Lisa K. Jorgenson; Robert Iannucci; Seed IP Law Group PLLC

(57) ABSTRACT

A self-repair method intervenes at the end of an operation of modification of a nonvolatile memory, selected between programming and erasing, in the event of detection of just one non-functioning cell, and carries out redundancy of the non-functioning cell. To this end, the memory array is divided into a basic portion, formed by a plurality of memory cells storing basic data, and into an in-the-field redundancy portion. The in-the-field redundancy portion is designed to store redundancy data that include a correct content of the non-functioning cell, the address of the non-functioning cell, and an activated redundancy flag. The redundancy is activated only after applying a preset maximum number of modification pulses and uses a redundancy replacement circuit and a redundancy data verification circuit.

31 Claims, 7 Drawing Sheets

SELF-REPAIR METHOD FOR NONVOLATILE MEMORY DEVICES USING A SUPERSECURE ARCHITECTURE, AND NONVOLATILE MEMORY DEVICE

BACKGROUND OF THE INVENTION

1. Field of the Invention

The present invention relates to a self-repair method for nonvolatile memory devices using a supersecure architecture, and a nonvolatile memory device.

2. Description of the Related Art

As is known, in a semiconductor multimegabit nonvolatile memory device (EPROM or flash), the cell array occupy a substantial fraction, accounting for between 40% and 70% of the total area. The applications for which nonvolatile memories are designed impose the need for perfect functionality of all the cells in the array during the operation of the device (reading, programming and erasing).

In theory, the presence of at least one cell that does not operate correctly is sufficient for the entire memory device to be unusable. This condition is of considerable importance during the process of industrial fabrication of this type of integrated device, in so far as there exists a non-zero likelihood of failure of a memory cell in any given production lot.

In the absence of solutions for detecting and correcting failure bits, the likelihood of having devices with perfectly operating memory cells in a given production lot would be very low and hence unacceptable from the point of view of large-scale industrial production. This value indicates the so-called "prime yield" of the lot and represents a figure of merit of the production process.

In order to increase the yield of memory devices in the final production steps, circuit solutions have been employed for recognizing and correcting the failure bits. A technique commonly adopted for this purpose uses additional memory cells to those making up the memory array and designed to replace corresponding failed array cells. The cells used, defined as redundant cells or redundancy cells, are identical to the array cells. They must be appropriately managed by additional circuits to those already normally present inside the device.

In particular, the organization of the memory favors the use of entire rows or entire columns made up of redundant cells, such as to replace corresponding rows or columns of the array even in the presence of just one failed cell. In this way, a compromise is reached between the power for correcting the failures and the area required for the circuits managing the redundancy.

Usually, activation of redundancy occurs during the electrical wafer sorting (EWS) step, during which, using an appropriate test flow, the cells that present some problems are identified and replaced with the redundancy cells. The redundancy, whether row redundancy or column redundancy, is thus able to correct only the defects that occur at time zero, i.e., in the factory.

For instance, should a sensible reduction in gain arise for a given cell, on account of cycling, the cell could no longer be able to get over the erasing and programming steps, so causing breakdown of the entire device.

Such an occurrence is increasingly frequent in the case of memories that use a long internal word, for example, a 64-bit or 128-bit word, as frequently occurs in present memories, in particular in the case of multilevel nonvolatile memories, where a number of bits are stored per cell, and in the case of memories with synchronous (burst) reading.

In fact, in the case of multilevel memories, where the difference in the threshold voltages between the different levels is reduced and thus a very precise control is required on the stored charge, it is advantageous, during programming, to apply a linearly increasing staircase voltage. Programming, however, becomes slow, so that in order to obtain a programming time of a single byte comparable to that of a conventional two-level cell, it is necessary to program more cells in parallel.

In addition, in the case of synchronous reading, the data are outputted in a synchronous manner, being controlled by an external clock. The frequency of the clock is, in general, higher than that of the asynchronous access time. Consequently, it is necessary to read a very much longer binary word internally than the one that is supplied at output in order to have a reserve from which it is possible to draw for different clock periods.

BRIEF SUMMARY OF THE INVENTION

Consequently, in all the above cases, the need is felt for a system that will maintain the functionality of the memory also in the case of isolated failures that occur during operation of the memory.

An embodiment of the present invention is a self-repair method for a nonvolatile memory including a memory array formed by a plurality of cells, each of which stores a datum. The method includes: performing a modification operation on data of the memory array, the modification operation being chosen between programming and erasing; verifying whether the data of the memory cells is correct after performing the modification operation; and when the verifying step has revealed a non-functioning cell, replacing the non-functioning cell in response to the verifying step.

Another embodiment of the present invention is a corresponding memory device.

BRIEF DESCRIPTION OF THE SEVERAL VIEWS OF THE DRAWINGS

For an understanding of the present invention preferred embodiments thereof are now described, purely by way of non-limiting example, with reference to the attached drawings, wherein.

DETAILED DESCRIPTION OF THE INVENTION

The invention is based upon the activation of self-repair procedures through in-the-field self-replacement by the memory when, during writing and/or erasing, one or more failed cells are detected. The above procedures thus enable subsequent continuation of use of the memory, without discarding it.

According to the invention, a memory architecture, referred to hereinafter as "supersecure memory," is proposed, wherein each word comprises, in addition to the bits of the standard datum, further self-repair bits including at least one guard bit which informs whether the standard-datum bits are correct, at least one correct bit, which stores the correct datum (in the presence of a standard datum failure bit) and additional address bits, which identify which of the standard datum bits is a failure bit. In the case of a failure, the self-repair bits are activated and, during reading, the erroneous standard datum bit is automatically replaced by the correct bit.

To this end, the memory array is equipped with an additional portion, which is provided with its own outputs for enabling in-the-field redundancy and is designed to contain information necessary for activation of in-the-field redundancy.

An implementation of the supersecure memory according to the principles set forth above is shown in the block diagrams of FIGS. 1 to 5, regarding the particular case of an internal word of the memory of 64 bits.

Figure 1:
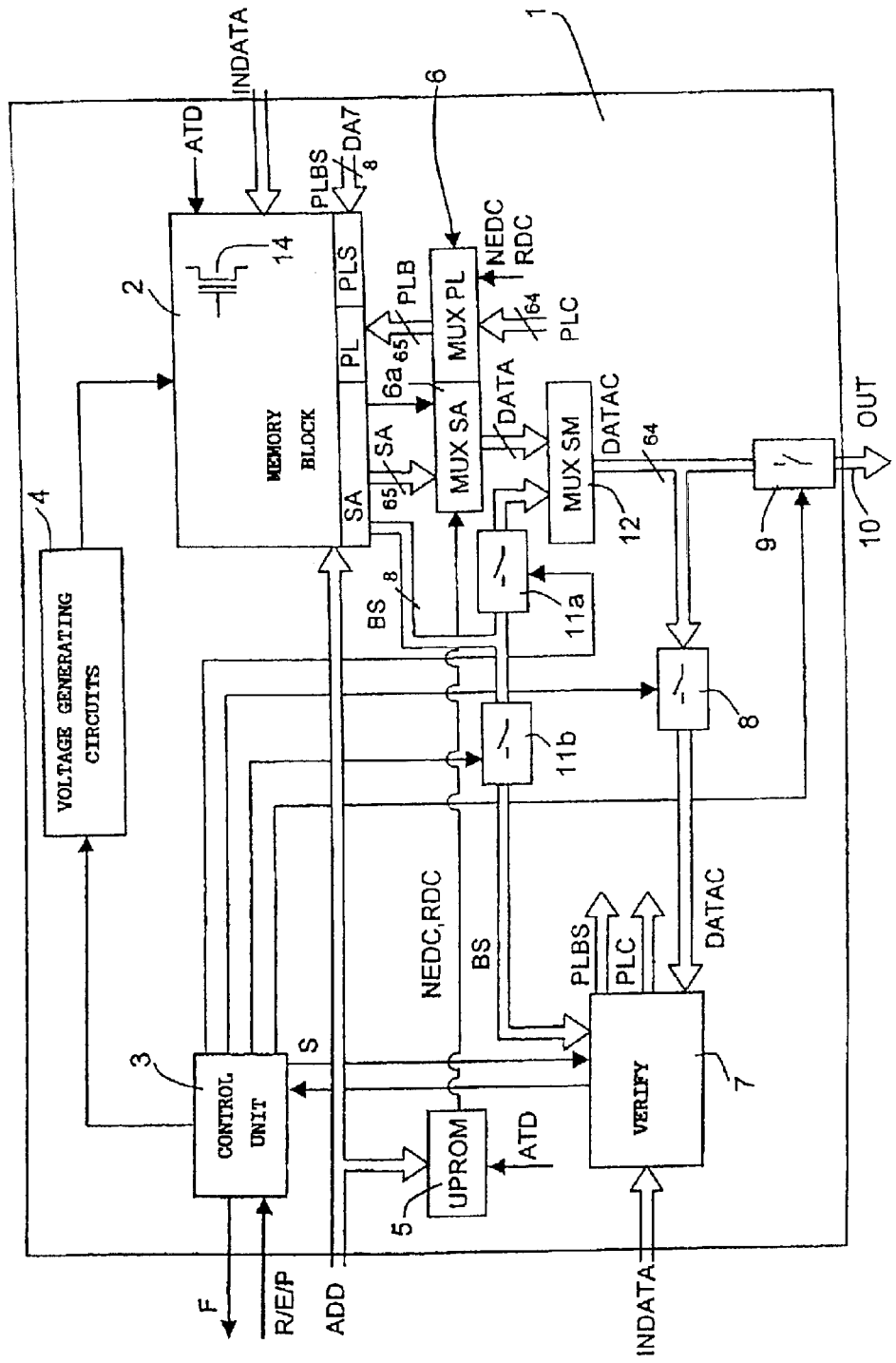
FIG. 1 is a block diagram of an embodiment of the invention.

In FIG. 1, a nonvolatile memory device 1 comprises a memory block 2 including a memory array formed by a plurality of nonvolatile cells 14 (only one of which is shown in FIG. 1), row addressing and column addressing circuits and read circuits (sense amplifiers) SA, as is better illustrated with reference to FIG. 2. In addition, the memory block 2 comprises a first set of programming switches PL for the cells that are to store the standard datum bits, and a second set of programming switches PLS for the cells that are to store the self-repair bits, as will be described in greater detail hereinafter.

A control unit 3 receives from outside signals R/E/P for the operation (reading, erasing, programming) that is to be performed, issues a failed memory signal F, and controls biasing voltage generating circuits 4, which supply the appropriate biasing to the memory block 2. A UPROM bank 5, initialized during the EWS test so as to store the data for the standard redundancy, receives an address modify signal ATD (generated internally by appropriate known circuits, not shown) and addresses ADD (supplied from outside) for the cells to be addressed. The UPROM bank 5 moreover sends signals NEDC and RDC, which respectively indicate EWS redundancy activation and the output corresponding to the cell to be replaced, to a redundancy multiplexer 6. The addresses ADD are moreover supplied to the memory block 2, as likewise are the data INDATA, in a known way.

Figure 4:
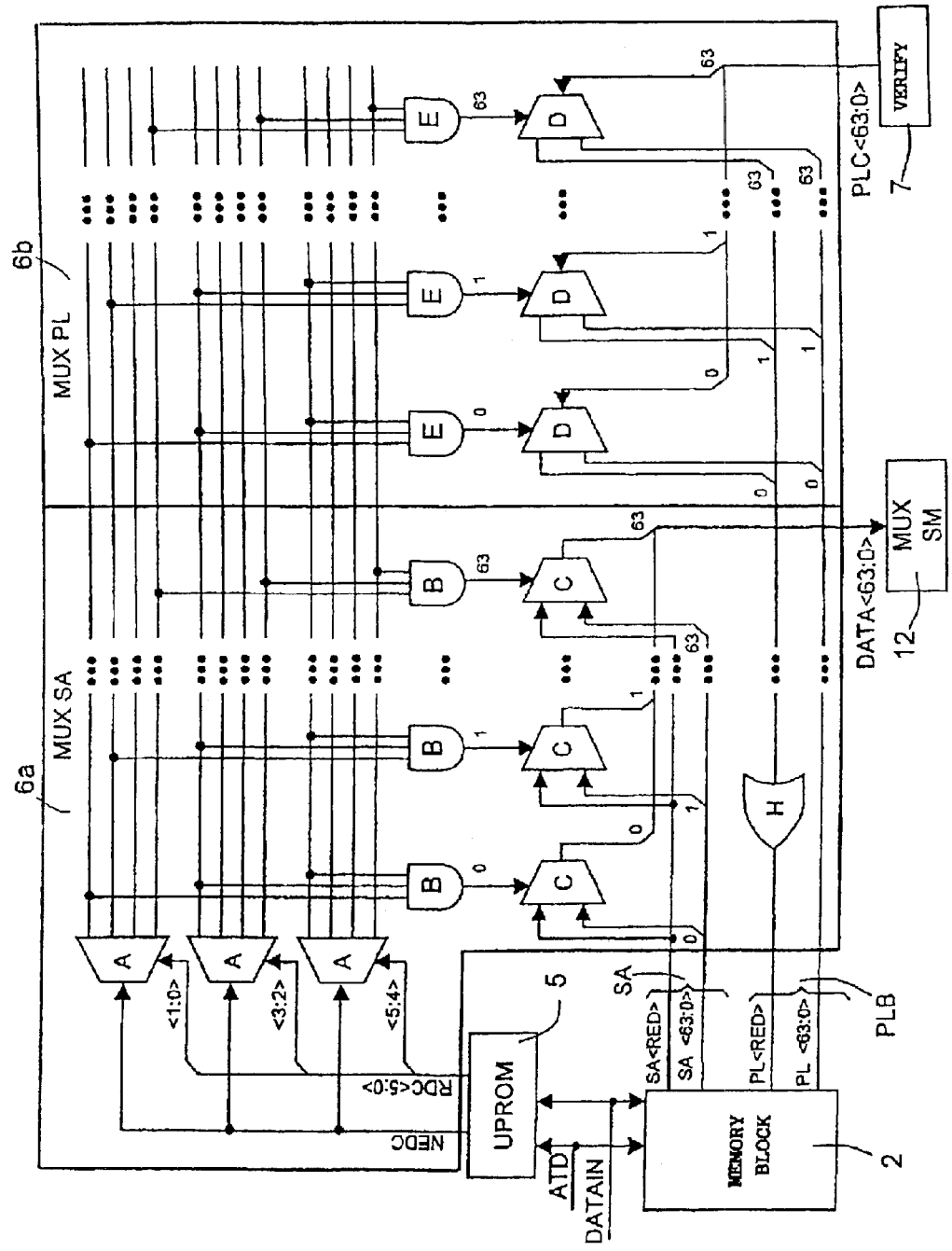

The redundancy multiplexer 6 (the detailed structure whereof is shown in FIG. 4) is divided into a first part 6a, called MUX SA, and a second part 6b, called MUX PL. The first part 6a receives 65 read bits SA from the memory block 2 and supplies 64 replaced bits DATA to a supersecure memory multiplexer 12, as will be described in greater detail hereinafter. The second part 6b receives programming data PLC from a programming state verify and memory block 7 and supplies to the first set of switches PL of the memory block 2 programming control signals PLB. Both parts 6a, 6b receive the signals NEDC and RDC. The supersecure memory multiplexer (MUX SM) 12 moreover receives from the memory block 2, via a first switch 11a controlled by the control unit 3, eight security bits BS (as described below). In addition, it supplies at output 64 corrected bits DATAC. The security bits BS are moreover directly supplied also to the programming state verify and memory block 7 via a second switch 11b controlled by the control unit 3 in phase opposition with respect to the first switch 11a, as explained in detail hereinafter.

The corrected bits DATAC outputted by the secure memory multiplexer 12 are supplied to the programming state verify and memory block 7 via a third switch 8 controlled by the control unit 3, or to an output 10 of the device 1 via a fourth switch 9, which is also controlled by the control unit 3. The output 10 may be formed by a datum pin or may be connected to other devices integrated in the same chip. Upstream of the output 10 there may moreover be provided an I/O logic (not illustrated), which enables input/output of the bits of just one (8/16/32 bit) word at a time.

The programming state verify and memory block 7 moreover exchanges control signals S with the control unit 3. In particular, it receives activation and reset signals and sends verify result signals, as is explained in greater detail with reference to FIG. 3. In addition, the programming state verify and memory block 7 receives from outside input data INDATA and supplies security programming control signals PLBS to the second set of switches PLS of the memory block 2.

Figure 2:
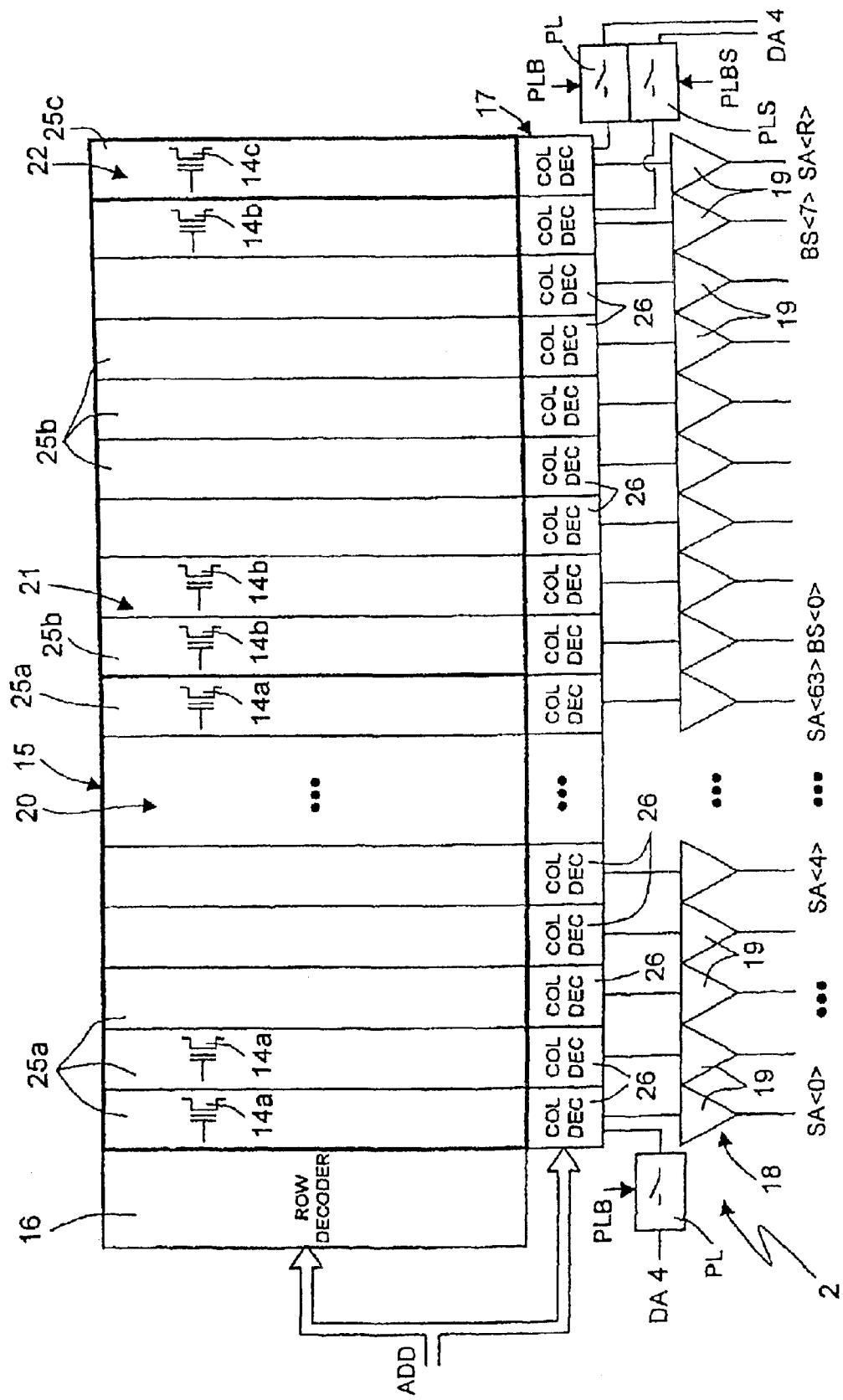
FIGS. 2 to 5 are more detailed diagrams of some blocks of FIG. 1.

As illustrated in detail in FIG. 2, the memory block 2 is formed by a memory array 15, a row decoder 16, a column decoder 17, a read circuit 18, and the programming switches PL and PLS, only some of which are illustrated in FIG. 2 for reasons of clarity.

The memory array 2 is formed by a first portion 20, for storing the basic data, a second portion 21, for implementation of in-the-field redundancy, and a third portion 22 for factory-activated redundancy at the end of the manufacturing process.

The read circuit 18 is formed by a plurality of sense amplifiers 19.

In detail, the first portion 20 of the memory array 15 comprises a first plurality of groups of columns 25a (in the example considered, 64 groups). The second portion 21 comprises a second plurality of groups of columns 25b (in the example considered, 8 groups). The third portion 22 comprises a group of columns 25c. In a known way, each group of columns 25a, 25b, 25c is connected to an own column decoding unit 26. In greater detail, each group of columns 25a, 25b, 25c comprises a plurality of memory cells 14a, 14b, 14c and is connected, through bitlines (not illustrated) to the same column decoding unit 26. Each column decoding unit 26 is in turn connected to an own sense amplifier 19. In the figure, the cells 14a belong to the groups of columns 25a and are therefore designed for storing the basic data. The cells 14b belong to the groups of columns 25b and are thus designed for storing the in-the-field redundancy data (security bits). The cells 14c belong to the group of columns 25c and are thus designed for storing the EWS redundancy bits.

The programming switches PL and PLS are each arranged between a respective column decoding unit 26 and the biasing voltage generating circuits 4 and are controlled by the respective programming control signals PLB and PLBS.

Altogether, then, there are seventy-three sense amplifiers 19, which supply basic datum bits SA<0>-SA<63> for the data originally stored, security bits BS<0>-BS<7> and an EWS redundancy bit SA<RED>. The security bits BS<0>-BS<7> are used for storing a guard bit, a correct datum bit, and six failed cell address bits. In particular, the guard bit (for example, the security bit BS<0>) may assume two values: a first value, corresponding to the inactive state, must be the end-of-erase value, which, in the case of flash memories of the NOR type, is "1"; and a second value, corresponding to the active state, is here equal to "0". In practice, when it is equal to "1", the guard bit BS<0> indicates that the data present in the first portion 20 of the memory array 15 are correct, whilst, when it is equal to "0", it indicates that one of the sixty-four datum bits SA<0>-SA<63> has failed during operation of the device and needs to be replaced with the correct datum bit. The correct datum bit (for instance, the security bit BS<1>) stores the contents that could not be stored in the failed cell, as explained hereinafter. The failed cell address bits (for example, the security bit BS<2>-BS<7>) indicate the address of the incorrect datum bit SA<0>-SA<63> that has been replaced.

Figure 3:
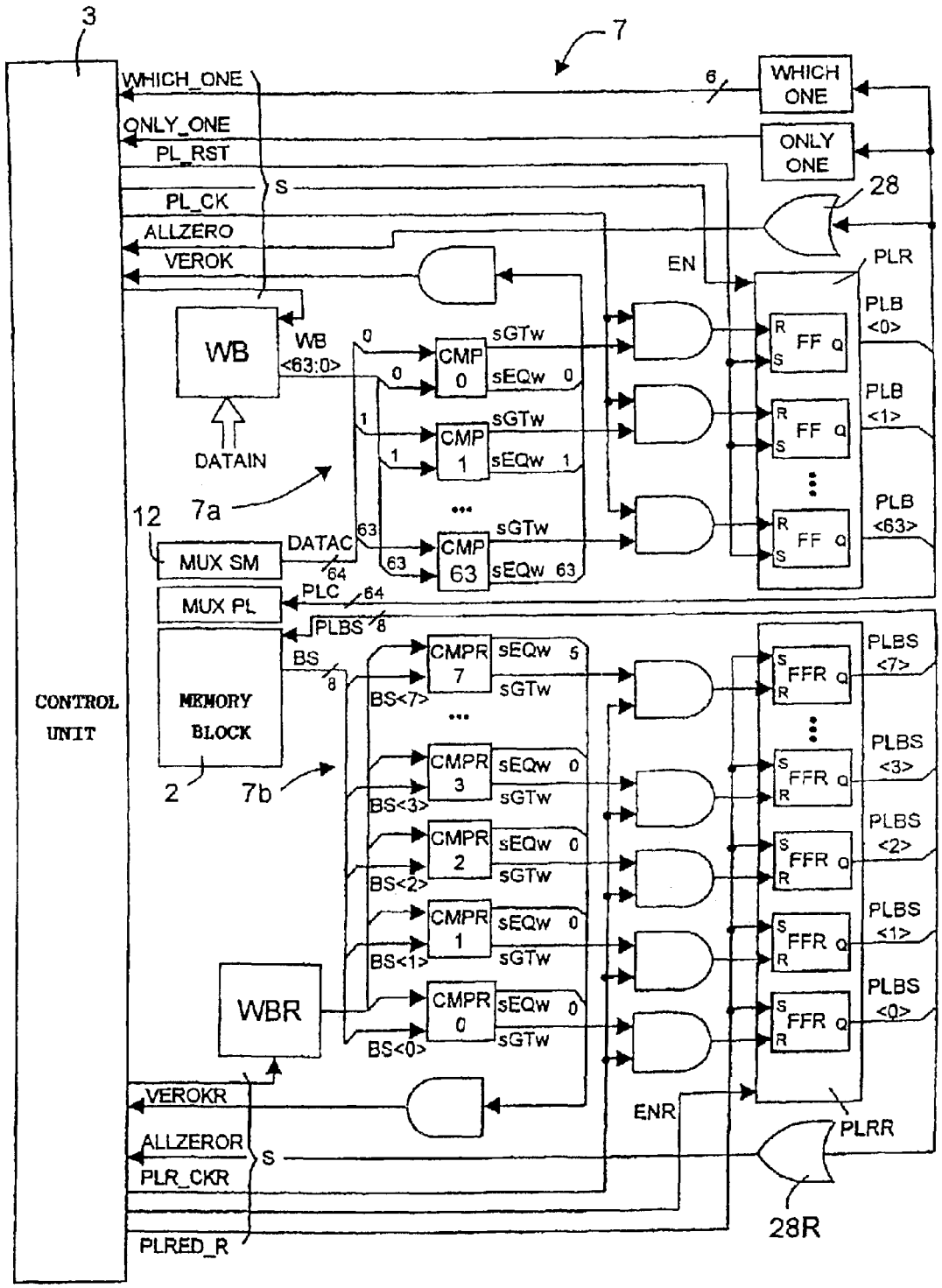

FIG. 3 shows a simplified circuit diagram of the programming state verify and memory block 7. The data to be written in the first portion 20 of the memory array 15 (data INDATA supplied from outside during a programming operation; bits "1" in the case of an erasing operation, these bits being generated following upon a special control signal coming from the control unit 3) are stored in a write buffer WB, which each time stores a word or a page. The data to be written in the second portion 21 of the memory array 15 (security bits upon activation of redundancy, bits "1" in the case of an erasing operation) are supplied by the control unit 3 and are stored in a security write buffer WBR, also this buffer storing a word or page each time.

The programming state verify and memory block 7 is basically divided into two parts: a top part 7a, which manages the basic bits, and a bottom part 7b, which manages the security bits. The two parts 7a, 7b are structured in a similar way but comprise a different number of components, given that the top part 7a operates on 64 bits, whilst the bottom part 7b operates on eight bits. The two parts 7a, 7b will therefore be described at the same time, using the same reference numbers and adding the letter R to indicate the components of the bottom part 7b.

In each part 7a, 7b a programming state register PLR, PLRR is formed by a plurality of memory elements (one for each bit), represented in the figure by flip-flops FF, FFR. The programming state registers PLR, PLRR are activated alternately, as described below, through turning-on signals EN and ENR supplied by the control unit 3.

In the programming step, each memory element FF, FFR maintains the information for the programming state of the respective cell and is active (i.e., it closes a switch of the first group PL or of the second group PLS, FIG. 1, which enables supply of the programming voltage to the corresponding cell) when the cell requires further programming pulses, and is inactive if the cell is correctly programmed. For example, a memory element FF, FFR has a "1" output when it is active and a "0" output when it is inactive.

Likewise, during erasing, the memory elements FF, FFR maintain the information as to whether the respective cell has been correctly erased or not. In the latter case, they do not control the switches of the cells. In particular, according to which memory element FF is active (or which elements are active), the programming state register PLR maintains the information regarding which cells are not functioning at the end of erasing or programming, as described hereinafter with reference to the flowcharts of FIGS. 6 and 7.

The outputs of the memory elements FF of the top part 7a are connected to two combinatorial circuits, namely a single-element detecting circuit ONLY_ONE and an coding circuit WHICH ONE. In particular, the single-element detecting circuit ONLY ONE generates a binary signal ONLY_ONE, which has a first value when a single memory element FF supplies the information that the corresponding cell requires further programming or erasing pulses; otherwise, it has a second value. The coding circuit WHICH ONE generates a binary number that identifies the bit that has not been correctly programmed or erased. For instance, in the case considered of a 64-bit binary word, six bits are necessary for identifying them. If the incorrectly programmed bit or the incorrectly erased bit is the second one, the coding circuit WHICH ONE supplies at output "00010".

The outputs of the memory elements FF and FFR are moreover connected to two OR gates 28, 28R, which generate a respective register state signal ALLZERO, ALLZEROR. These signals communicate to the control unit 3 when all the memory elements FF, FFR have been de-activated and hence all the corresponding cells are correctly programmed or erased. The contents of the memory elements FF, FFR are updated by the control unit 3 after each respective verify operation by means of an updating signal PL_CK, PL_CKR.

Prior to activation of redundancy in-the-field, corrected bits DATAC are supplied by the supersecure memory multiplexer 12, these bits referring only to the basic bits (with possibly activated just the EWS redundancy). In this step, the bottom part 7b is inactive and is activated only when, at the end of programming, just one basic bit is found to be incorrectly programmed. In this case, as is explained in detail hereinafter with reference to FIG. 7, the security bits BS are supplied by the memory block 2 to the bottom part 7b through the switch 11b (not illustrated in FIG. 3 for reasons of simplicity) and are verified. After activation of the redundancy in-the-field, the correct datum bit BS<1> is automatically replaced by the supersecure memory multiplexer 12. The corrected bits DATAC thus obtained are then verified in the top part 7a, and the bottom part 7b is kept disabled.

Each individual corrected bit DATAC and each individual security bit BS supplied by the supersecure memory multiplexer 12 or by the memory block 2 is compared with the respective bit stored in the write buffer WB, or WBR through comparators CMP, CMPR, each of which supplies an equality signal sEQw and an overprogramming signal sGTw. The equality signal sEQw is equal to "1" if the corresponding corrected bit DATAC coincides with the one present in the write buffer WB, WBR. The overprogramming signal sGTw is equal to "1" if the two bits are equal or when the cell has been erroneously overprogrammed.

The verify signal VEROK, VEROKR is active when all the corrected bits DATAC or all the security bits BS verified at that moment coincide with the ones present in the write buffer WB, WBR.

The control unit 3 initializes all the memory elements FF, or FFR (according to whether the corrected bits DATAC or the security bits BS are verified), setting them in the active state, and resets a counter which stores the number of respective modification (programming or erasing) pulses applied. In the case of modification of the corrected bits DATAC, after application of an erasing or programming pulse to the cells, the addressed cells are read, and the memory elements FF are updated by the update signal PL_CK. If all the memory elements FF of the top part 7a are de-activated (register state signal ALLZERO=1), there are no more cells requiring a modification pulse. In addition, if all the cells read have the correct information content (verify signal VEROK active), there are no cells requiring a further programming or erasing pulse, and the erasing or programming operation terminates. If ALLZERO=1 but VEROK=0 (some cells overprogrammed), a malfunctioning signal is generated. Instead, if the signal ONLY_ONE is active, the redundancy is activated in-the-field. When the redundancy is activated in-the-field, the verification of the security bits proceeds in a way similar to the above. In particular, if all the memory elements FFR of the bottom part 7b are de-activated (register state signal ALLZEROR=1), verification on the redundancy bits is considered to have gone through successfully; otherwise, the memory is considered failed, as is described in detail hereinafter with reference to FIGS. 6 and 7.

Following upon activation of the redundancy in-the-field, the bottom part 7b is deactivated.

FIG. 4 illustrates a simplified circuit diagram of the redundancy multiplexer 6.

The redundancy multiplexer 6 is activated by a change address signal ATD generated by an appropriate logic (not illustrated) in a known way. Upon receipt of the change address signal ATD, the memory block 2 and the UPROM block 5 are read. The 64-datum bits SA<63:0> and the EWS redundancy bit SA<RED> are read from the memory block 2 (see FIG. 2), and are supplied to the first part 6a (MUX SA of the redundancy multiplexer 6).

The UPROM block supplies a redundancy signal NEDC which, when active, indicates that the redundancy bit must be replaced by a datum bit SA<63:0>, and a redundancy address RDC, of six bits, indicating which of the 64 datum bits SA<63:0> is to be replaced by the EWS redundancy bit SA<RED>.

The redundancy signal NEDC and the redundancy address RDC are supplied to three demultiplexer blocks A, the outputs of which are supplied (just as they are or negated, as obvious to a person skilled in the art) to sixty-four AND gates B, one for each bit, the outputs of which indicate whether the corresponding bit is to be made redundant.

The outputs of the AND gates B control a group of 64 multiplexer elements C, which replace the respective bit with the redundancy bit.

In detail, one of the multiplexer elements C, if activated by the corresponding AND gate B, replaces the respective datum bit SA<i> with the EWS redundancy bit SA<RED> and supplies the replaced bits DATA thus obtained to the supersecure memory multiplexer 12.

In addition, the outputs of the three demultiplexer blocks A are supplied Oust as they are or negated) to sixty-four AND gates E, one per bit, the outputs of which indicate whether the corresponding bit is to be made redundant or not. The outputs of the AND gates E control a group of 64 multiplexer elements D, which route the respective programming control bit PLC towards the respective basic cell 14a or the EWS redundancy cell 14c (see FIG. 2). In practice, if the redundancy has been activated during the EWS test, one of the multiplexer elements D, activated by the corresponding AND gate E, transfers the corresponding switch activation/de-activation control PLC<i> to the respective programming switch PLS (bit PL<RED>) through the OR gate H, and de-activates the respective programming switch PL associated to the failed basic cell 14a.

Figure 5:
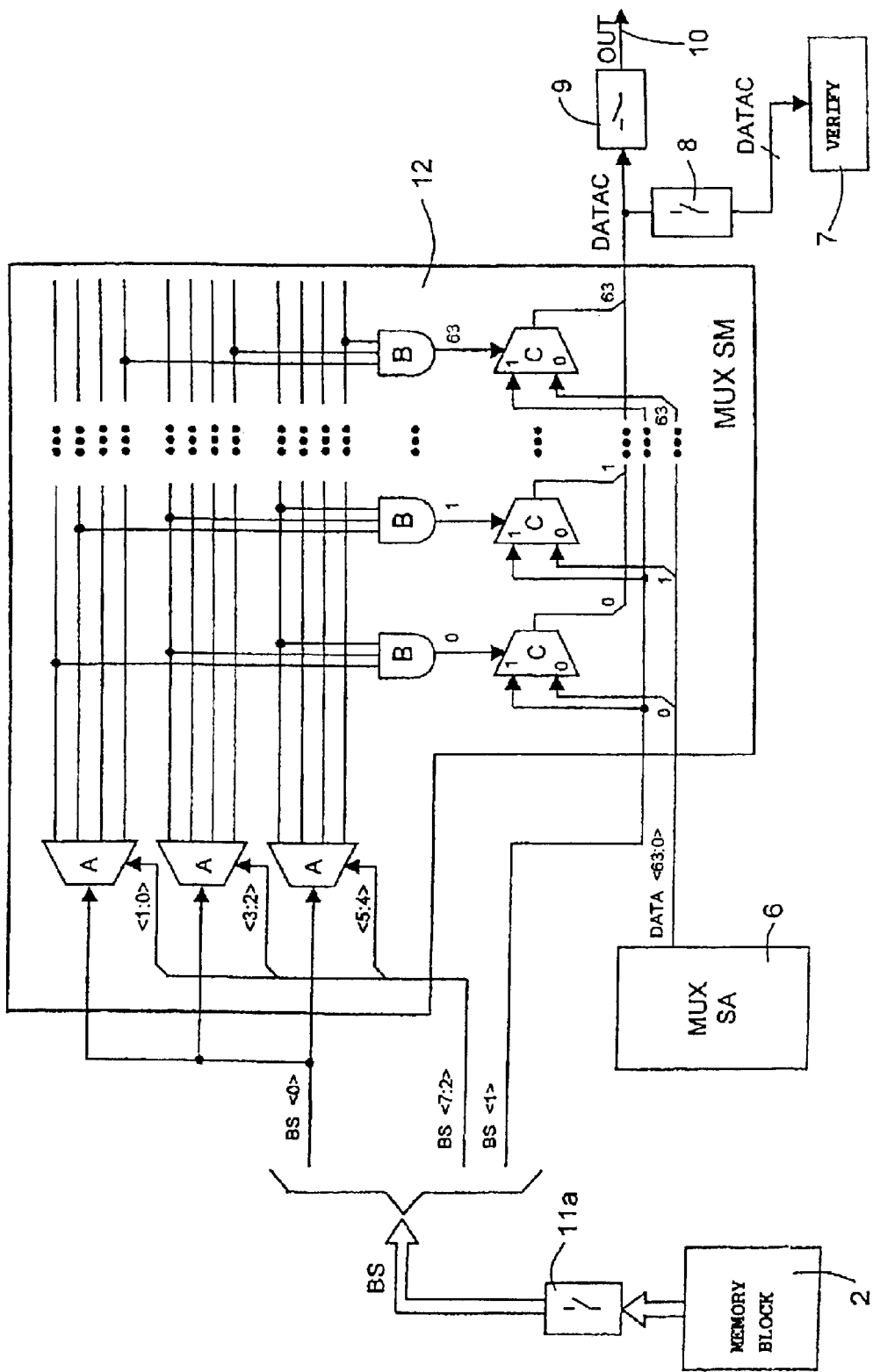

FIG. 5 shows a simplified circuit diagram of the supersecure memory multiplexer 12. This diagram is similar to the diagram of FIG. 4, namely to the first part 6a, and behaves in a similar way, except that the inputs of the three demultiplexer blocks A are connected to the memory block 2 through the first switch 11a and receive the guard bit BS<0> and the failed cell address bits BS<2>-BS<7>. The correct datum bit BS<1> is supplied by the memory block 2 to the multiplexer elements C.

Consequently, before the redundancy is activated, when the guard bit BS<0> is in its inactive state ("1"), no replacement is made, and the corrected bits DATAC supplied to the programming state verify and memory block 7 are identical to the replaced bits DATA supplied by the redundancy multiplexer 6. After activation of the redundancy, when the guard bit BS<0> is in its active state ("0"), the erroneous bit, the address whereof is specified by the failed cell address bit BS<2>-BS<7>, is replaced by the correct datum bit BS<1>.

Figure 6:
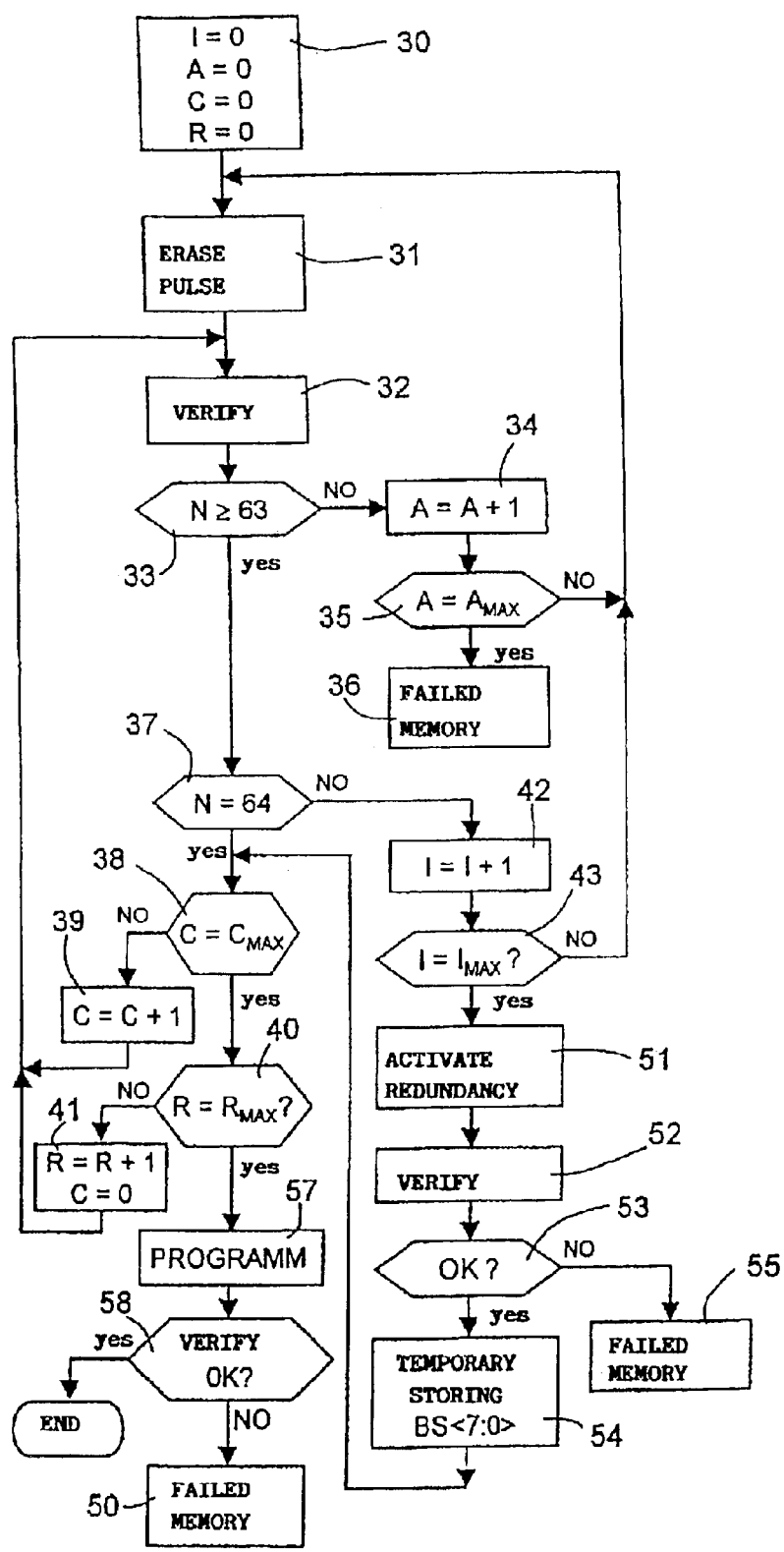
FIGS. 6 and 7 are flowcharts corresponding to erasing and programming operations, respectively, performed using a method according to an embodiment of the invention.

FIG. 6 illustrates a flowchart of an erasing operation carried out using the supersecure memory architecture illustrated in FIGS. 1 to 5. Erasing envisages a first step of applying erasing pulses to an entire sector, verifying the basic data (64 basic bits, one of which in case made redundant by the redundancy multiplexer 6), word by word, and applying further erasing pulses until all the cells (except, at the most, one) of each word are erased, or up to a maximum number of pulses. If there remains a single cell of a word not completely erased, the security bits are verified. If necessary, additional pulses are supplied. If the security bits are correct, the data regarding the redundancy in-the-field (address of the cell failed, correct content, in this case equal to "1", and guard bit), as well as the address of the word to which they refer, are stored in a temporary way in an appropriate memory register, and then further words are verified. Otherwise, the memory is considered failed. At the end of erasing, the security bits are programmed in the second portion 21 of the memory array 15 (FIG. 2).

In detail, initially, step 30, some counters, and precisely an additional-pulse counter I, an erasing-pulse counter A, a column counter C, and a row counter R, are set to zero.

Next, step 31, an erasing pulse is sent to an entire sector and then, step 32, a verify reading of one first 64 bit word (addressed by the counters R and C) is performed. If the result of the verify reading is positive for fewer than 63 cells (i.e., there are at least two cells that have not been erased correctly; output NO from block 33; signals ONLY_ONE of FIG. 3 and ALLZERO both in the same inactive state), the erasing-pulse counter A is incremented, step 34, and a check is made to see whether the maximum number of erasing pulses $A_{MAX}$ has been reached, step 35. If the maximum number has been reached (output YES from block 35), a failed memory signal F is generated, step 36, and the procedure terminates. If, instead, the result is negative (output NO from block 35), a new erasing pulse is supplied, step 31.

If the verify reading has yielded a positive result for at least 63 cells (i.e., only one cell of the word verified is not correctly erased; one of the signals ONLY_ONE of FIG. 3 and ALLZERO in the active state, output YES from block 33), a check is made to see whether all the cells of the verified word have been erased (step 37). If the result is YES (signal ALLZERO=1), step 38, a check is made to see whether all the columns have been verified. If the result is negative (signal ONLY_ONE=1), step 39, the column counter C is incremented and a new verify reading is performed, returning to step 32.

If all the columns have been verified (output YES from step 38), a check is made to see whether all the rows have been verified, step 40. If the result is negative, step 41, the row counter R is incremented and the column counter C is reset to zero, and a new verify reading is carried out, returning to step 32. If the result is positive, when the entire sector has thus been verified, step 57, the security bits BS (previously stored in a volatile way) are programmed in the respective locations (using the procedure described with reference to FIG. 7 for programming the security bits), and the written redundancy bits are verified and possibly a final verification is carried out, step 58. If verification in step 58 yields a positive result, the erasing procedure terminates immediately; otherwise, a failed memory signal F is generated, step 50.

If, at the end of the verify reading of a word only one cell is not erased (output NO from step 37), the additional-pulse counter I is incremented, step 42, and a check is made to see whether this is equal to the maximum number $I_{MAX}$, step 43. If the result is negative (output NO from step 43), a new erasing pulse is supplied, so returning to step 31. If the result is positive (output YES from step 43), the supersecure redundancy is activated to check whether the security bits BS have been erased correctly, step 51. To this end, the security bits BS are read and supplied to the programming state verify and memory block 7, where they are verified in the second part 7b, as described in detail with reference to FIG. 3, step 52. If the result is positive (output YES from step 53), the redundancy bit BS and the address of the failed word are temporarily stored in a register of the memory, step 54, and the procedure returns to step 38 to proceed with verifying other words. If the result is negative (output NO from step 53), a failed-memory signal F is generated, step 55, and the procedure terminates.

Figure 7:
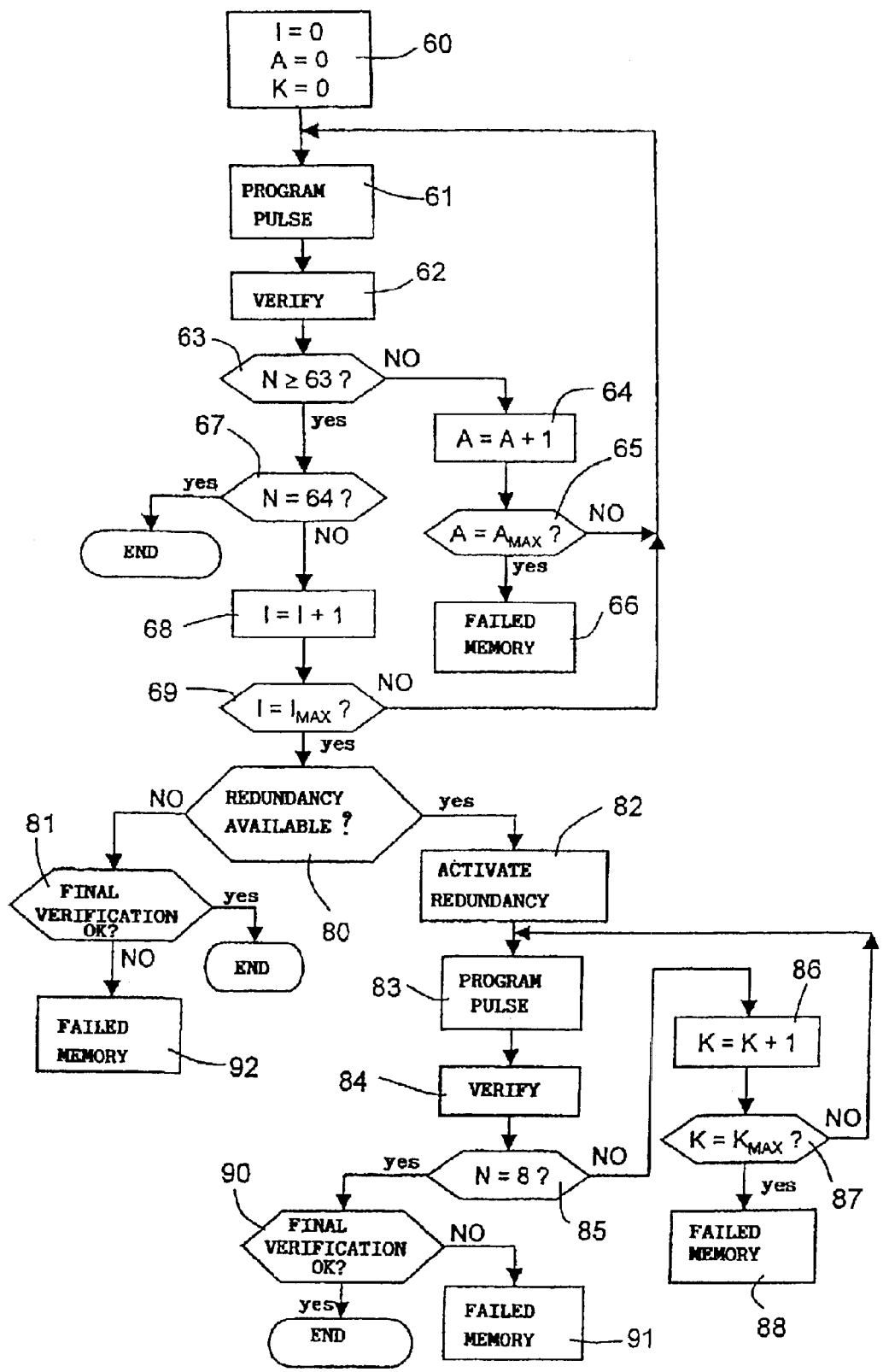

FIG. 7 illustrates a flowchart of a programming operation with the supersecure memory architecture of FIGS. 1 to 5. Programming comprises a first step of applying the programming pulses to the bits of the word that is to be programmed (64 basic bits, one of which possibly replaced or made redundant by the redundancy multiplexer 6), ignoring the security bits, then verifying the programmed basic bits and applying further programming pulses until all the cells (except at most one) of the word to be programmed are in the correct state or until a maximum number of pulses is reached. If only a single bit is not perfectly programmed, the security bits are programmed. If the security bits are not found to be correctly programmed after a maximum number of pulses has been applied, the memory is considered failed; otherwise, the basic bits made redundant with the security bits are possibly finally verified, and, if this final verification yields a positive result, the procedure terminates. If the final verification yields a negative result, the memory is considered failed.

In detail, initially, step 60, some counters are set to zero, namely an additional-pulse counter 1, a first programming-pulse counter A and a second programming-pulse counter K.

Next, step 61, a programming pulse is sent to the addressed word (in a per se known manner), and, step 62, a verify reading of the programmed word is performed. Then the number N of bits, the verification of which yields a positive result, is counted. If the result of the verification is positive for fewer than 63 cells (i.e., there are at least two cells not properly programmed, output NO from block 63), the programming-pulse counter A is incremented, step 64, and a check is made to see whether the maximum number of programming pulses ($A_{MAX}$) has been reached, step 65. If the maximum number has been reached (output YES from block 65), a failed-memory signal F is generated, step 66, and the procedure terminates. If, instead, the result is negative (output NO from block 65), a new programming pulse is supplied, step 61.

If the result of the verification is positive (output YES from step 63), a check is made to see whether all the cells of the verified word have been correctly programmed (N=64, step 67). If the result is YES, the programming procedure terminates. If the result is negative (when at the end of the verify reading just one cell has remained unprogrammed, output NO from step 67), the additional-pulse counter I is incremented (step 68). Then, a check is made to see whether the additional pulse counter I is equal to the maximum number $I_{MAX}$, step 69. If the result is negative (output NO from step 69), a new programming pulse is supplied, so returning to step 61. If the result is positive (output YES from step 69), a check is made to see whether redundancy resources are available, i.e., whether the redundancy has not already been activated previously, step 80.

If the redundancy has already been activated (output NO from step 80), a final check is made with redundancy activated, step 81, to verify whether the incorrectly programmed bit was the same one that had previously caused activation of the redundancy in-the-field. In this case (output YES from step 81), the procedure terminates; otherwise, a failed-memory signal F is generated, step 92, and the procedure terminates.

If, instead, the redundancy had not yet been activated (output YES from step 80), the supersecure redundancy is activated, step 82. In practice, a programming pulse is sent to the in-the-field redundancy cells 14b that are to store the guard bits, the correct-datum bits and the redundancy address bits BS<0>BS<7>, step 83. The verify reading of the security bits is carried out, step 84, by sending the security bits BS directly to the second part 7b of the programming state verify and memory block 7, through the second switch 11b of FIG. 1. A check is made to see whether all the eight security bits are correctly programmed, step 85. If they are not, the second programming pulse counter K is incremented, step 86. A check is made to see whether the maximum number of programming pulses has already been reached, step 87. If not (output NO from step 87), a further programming pulse is supplied, returning to step 83. If the maximum number of programming pulses has been reached (output YES from step 87), a failed-memory signal is generated, and the procedure terminates, step 88.

If the verify reading on the redundancy bits BS yields a positive result (output YES from step 85), a final verification is possibly made with redundancy activated, wherein the 63 basic non-redundancy bits and the correct-datum bit BS<1> are read, step 90. If the final verification yields a positive result for all of the 64 bits (output YES from step 90), the procedure terminates. If the result is negative (output NO from step 90), a failed-memory signal F is generated, step 91, and the programming procedure terminates.

The advantages of the described method and memory device are the following. First, the described method and memory device enable in-the-field self-repair of the memory during normal operation after an erasing or programming operation, when, after a standard maximum number of erasing/programming pulses has been supplied, it has not been possible to store a datum correctly, so overcoming the need to consider the memory device failed and hence to be replaced. This enables a considerable increase in the life of the memory, with consequent considerable savings in terms of costs.

The in-the-field redundancy method can in any case be applied also in the EWS testing step in the factory with the aim of simplifying its flow. In particular, the memory device could generate by itself the various patterns to be used for verifying its functionality and then proceed, once again by itself, to the correction. The possibility of application, during EWS, proves for example advantageous when the standard testing is very costly or complicated, for instance in devices used for storing images. In such cases, in fact, frequently the EWS test is not implemented, and it is not possible to discriminate failed devices that cannot be self-repaired from correctly functioning devices that can be self-repaired. Instead, the generation of control signals and the actuation of the verifications necessary within the memory render the in-the-field redundancy procedure simpler and more economically advantageous and hence more easily applicable than is the standard EWS test.

Finally, it is clear that numerous modifications and variations may be made to the memory and to the self-repair method described and illustrated herein, all of which fall within the scope of the present invention, as defined in the attached claims. For example, even though the self-repair procedure by in-the-field redundancy has been described with particular reference to the case of identification of failed cells during an erasing or programming step, it may be applied in-the-field also in the case of in-the-field identification of failed cells during standard in-the-field reading of the memory. In this case, identification of a failed cell is followed by a step of programming of the redundancy bits in a way similar to what has been described with reference to the programming step. In particular, the self-repair procedure by in-the-field redundancy described herein is applicable to memories equipped with error correction techniques that enable recognition and correction of errors revealed during reading and that use an error correcting code (ECC). In this latter case, should an error be detected during reading of a word, the ECC supplies the address of the erroneous bit and its correct value. The control unit 3 then generates a wait signal and activates writing of the security bits according to the information received.

In addition, although the foregoing description refers to the case of a single non-functioning cell, the invention also covers the case of redundancy of more than one non-functioning cell, in which case the redundancy portion of the memory array must be expanded to comprise a further portion for the redundancy of each additional cell which, following upon verification, proves to be non-functioning.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A self-repair method for a nonvolatile memory including a memory array formed by a plurality of cells, each of which stores a datum, comprising the steps of:
    performing a modification operation on data of said memory array, said modification operation being chosen between programming and erasing;
    verifying whether the data of said memory cells is correct after performing the modification operation; and
    when the verifying step has revealed a non-functioning cell, replacing said non-functioning cell in response to the verifying step, wherein said step of replacing comprises storing a correct content in a redundancy cell.

2. The method according to claim 1 wherein said step of replacing further comprises storing an address of said non-functioning cell and an activated redundancy flag.

3. A self-repair method for a nonvolatile memory including a memory array formed by a plurality of cells, each of which stores a datum, comprising the steps of:
    performing a modification operation on data of said memory array, said modification operation being chosen between programming and erasing;
    verifying whether the data of said memory cells is correct after performing the modification operation; and
    when the verifying step has revealed a non-functioning cell, replacing said non-functioning cell in response to the verifying step, wherein said verifying step comprises the steps of:
    determining the number of memory cells storing an incorrect datum;
    if said number of memory cells storing said incorrect datum is less than or equal to a threshold value, activating said replacing step.

4. The method according claim 3 wherein, after said replacing step, the step of verifying redundancy data is performed.

5. The method according to claim 4 wherein, if said step of verifying redundancy data yields a result indicating an error, an error signal is generated.

6. The method according to claim 4 wherein said redundancy data comprise information regarding a correct content, an address of said non-functioning cell, and an activated redundancy flag, and wherein said step of verifying redundancy data comprises verifying said information separately from said data of said cells.

7. The method according to claim 4 wherein said modification operation is an erasing operation carried out on the plurality of cells; said verifying step is carried out on a subset of said plurality of cells; and wherein, if said step of verifying redundancy data yields a correct result, said redundancy data are stored temporarily, said verifying step is repeated on other subsets of said plurality of cells, until complete verification of said plurality of cells; and, at the end of said complete verification, said redundancy data are written in a nonvolatile way in a redundancy portion of said memory array.

8. The method according to claim 4 wherein said modification operation is a programming operation performed on the plurality of cells which store a memory word, and said step of replacing said non-functioning cell comprises writing said redundancy data in a redundancy portion of said memory array.

9. A self-repair method for a nonvolatile memory including a memory array formed by a plurality of cells, each of which stores a datum, comprising the steps of:
    performing a modification operation on data of said memory array, said modification operation being chosen between programming and erasing;
    verifying whether the data of said memory cells is correct after performing the modification operation; and
    when the verifying step has revealed a non-functioning cell, replacing said non-functioning cell in response to the verifying step, wherein said modification operation is activated during an EWS testing step.

10. A self-repair method for a nonvolatile memory including a memory array formed by a plurality of cells, each of which stores a datum, comprising the steps of:
    performing a modification operation on data of said memory array, said modification operation being chosen between programming and erasing;
    verifying whether the data of said memory cells is correct after performing the modification operation; and
    when the verifying step has revealed a non-functioning cell, replacing said non-functioning cell in response to the verifying step, wherein said modification operation is activated during a step of normal in-the-field use of said nonvolatile memory.

11. A self-repair method for a nonvolatile memory including a memory array formed by a plurality of cells, each of which stores a datum, comprising the steps of:

performing a modification operation on data of said memory array, said modification operation being chosen between programming and erasing;

verifying whether the data of said memory cells is correct after performing the modification operation; and when the verifying step has revealed a non-functioning cell, replacing said non-functioning cell in response to the verifying step, wherein said method is carried out during a step of normal in-the-field use of said nonvolatile memory and further includes the steps of:

reading the data of the plurality of cells;

verifying whether the data of the read cells are correct; and when said step of verifying the data of the read cells has revealed a non-functioning cell, replacing said non-functioning cell revealed during verifying the data of the read cells.

12. A nonvolatile memory device, comprising:

a memory block comprising a memory array formed by a plurality of memory cells, each of which stores a datum;

modification means for modifying the data of said memory cells, said modification means performing an operation chosen between programming and erasing;

a correctness verify circuit for verifying the data of said memory cells, said correctness verify circuit generating an incorrect datum signal when a non-functioning cell is detected; and in-the-field redundancy means replacing said non-functioning cell and being enabled by said correctness verify circuit.

13. The device according to claim 12 wherein said in-the-field redundancy portion further comprises a plurality of second redundancy cells designed to store a non-functioning cell address information, and a third redundancy cell that is designed to store an activated redundancy flag.

14. The device according claim 12 wherein said memory array comprises a basic portion, comprising a plurality of memory cells storing basic data; and an in-the-field redundancy portion designed to store redundancy data and including a first redundancy cell designed to store a correct content of said non-functioning cell.

15. The device according to claim 14 wherein said memory array further comprises an EWS redundancy portion made up of an EWS redundancy cell.

16. The device according to claim 14 wherein said basic portion is connected to basic column decoding units and to basic sense amplifiers, and said in-the-field redundancy portion comprises a first group of columns connected to said first redundancy cell, a plurality of second groups of columns, each of said second groups of columns being connected respectively to one of a plurality of second redundancy cells for storing non-functioning cell address information, and a third group of columns connected to a third redundancy cell for storing an activated redundancy flag; each group of columns being connected to a redundancy column decoding unit and to a redundancy sense amplifiers.

17. The device according claim 16 wherein said redundancy sense amplifiers are connected to said correctness verify circuit.

18. The device according to claim 17 further comprising an in-the-field redundancy replacement circuit having data inputs connected to said basic sense amplifiers, control inputs connected to said redundancy sense amplifiers, and outputs connected to an output port of said memory device and to said correctness verify circuit.

19. The device according to claim 18, further comprising an EWS redundancy-replacement circuit, set between said basic sense amplifiers and of said EWS redundancy portion and said data inputs of said in-the-field redundancy replacement circuit, said EWS redundancy replacement circuit moreover having control inputs connected to a nonvolatile memory unit.

20. The device according to claim 18 wherein said correctness verify circuit comprises a first detection unit supplying at output information related to the number of memory cells that store an incorrect datum; and said modification means comprise a redundancy activation unit, connected to said first detection unit and generating a redundancy activation signal when the number of said memory cells storing an incorrect datum is less than or equal to a predetermined threshold value.

21. The device according to claim 20, comprising cell modification pulses generating means enabled in absence of said redundancy activation signal, and wherein said modification means further comprise first maximum-number-of-pulses detecting means which generate information on the maximum number of cell pulses when a maximum number of modification pulses has already been supplied to said memory cells, said redundancy activation unit being moreover activated in absence of said information on the maximum number of cell pulses.

22. The device according to claim 20 wherein said correctness verify circuit further comprises a second detection unit supplying at output information related to the number of redundancy cells that store an incorrect datum; and redundancy confirm means, connected to said second detection circuit and generating a enabled redundancy signal when all the redundancy cells store an incorrect datum.

23. The device according to claim 22, comprising programming circuits for applying redundancy programming pulses to said redundancy cells in absence of said enabled redundancy signal and in presence of said redundancy activation signal; and second maximum-number-of-pulses detecting means, generating a failed memory signal in absence of said enabled redundancy signal and when a predetermined maximum number of said redundancy programming pulses has been exceeded.

24. The device according to claim 22, comprising temporary writing means for writing said redundancy data enabled by said enabled redundancy signal at an end of a step of erasing of said memory array, and nonvolatile writing means for writing said redundancy data in said in-the-field redundancy portion at the end of the step of erasing of said memory array.

25. The device according to claim 18 wherein said redundancy data comprise information on an address of the non-functioning cell, and an activated redundancy flag, and wherein said in-the-field redundancy replacement circuit comprises a plurality of multiplexer circuits, each of which has a first data input connected to a respective one of said basic sense amplifiers, a second input connected to one of said redundancy sense amplifiers, a selection input, and an output, said outputs of said multiplexer circuits forming said outputs of said redundancy replacement circuit; said in-the-field redundancy replacement circuit further including an addressing circuit receiving said address information and said activated redundancy flag) and supplying a replacement activation signal to said selection input for selecting one of said multiplexer circuits specified by said address information and in presence of said activated redundancy flag.

26. A method for using a nonvolatile memory including a plurality of memory cells, comprising:

writing input data to the memory cells;

verifying whether the input data written to the memory cells was written correctly; and if the verifying step has revealed that an incorrect datum was written to a non-functioning memory cell of the memory cells, replacing the non-functioning memory cell with a redundancy memory cell.

27. The method of claim 26 wherein the writing step is part of an erase operation.

28. The method of claim 26 wherein the verifying step includes temporarily storing the input data in a write buffer and comparing data actually stored in the memory cells by the writing step with the input data stored in the write buffer.

29. The method of claim 26, further comprising:

writing an input datum of the input data to the redundancy memory cell;

verifying whether the input datum written to the redundancy memory cell was written correctly; and if the correct datum was not written correctly to the one of the memory cells, then generating an error signal.

30. The method of claim 26 wherein, prior to the step of replacing the non-functioning memory cell, the steps are performed of:

verifying whether a maximum number of modification pulses has already been supplied; and if a maximum number of modification pulses has not already been supplied, supplying a modification pulse, wherein the step of replacing the non-functioning memory cell is performed only if the maximum number of modification pulses has already been supplied.

31. The method of claim 26 wherein the writing step is part of an erase operation and the verifying step includes:

verifying a first subset of the plurality of memory cells;

verifying a second subset of the plurality of memory cells only after the step of verifying the first subset confirms that the data written to the memory cells of the first subset was written correctly.

* * * * *